United States Patent
Kim et al.

(10) Patent No.: US 9,826,662 B2
(45) Date of Patent: Nov. 21, 2017

(54) REUSABLE PHASE-CHANGE THERMAL INTERFACE STRUCTURES

(71) Applicant: General Electric Company, Schenectady, NY (US)

(72) Inventors: Joo Han Kim, Niskayuna, NY (US); Graham Charles Kirk, Milton Keynes (GB); Jay Todd Labhart, Cary, NC (US); Binoy Milan Shah, Queensbury, NY (US); Yogen Vishwas Utturkar, Niskayuna, NY (US); Pramod Charmarthy, Revere, MA (US); Tao Deng, Shanghai (CN)

(73) Assignee: General Electric Company, Niskayuna, NY (US)

( * ) Notice: Subject to any disclaimer, the term of this patent is extended or adjusted under 35 U.S.C. 154(b) by 269 days.

(21) Appl. No.: 14/103,868

(22) Filed: Dec. 12, 2013

(65) Prior Publication Data

US 2015/0168087 A1  Jun. 18, 2015

(51) Int. Cl.
*H05K 7/20* (2006.01)
*F28F 21/08* (2006.01)
(Continued)

(52) U.S. Cl.
CPC ......... *H05K 7/20454* (2013.01); *C09K 5/063* (2013.01); *F28F 21/08* (2013.01);
(Continued)

(58) Field of Classification Search
CPC .............................. F28F 21/08; H05K 1/0203
USPC ........................ 165/80.2, 185; 174/16.3, 260; 257/E23.089, E23.101, 675, 702–708, 257/711, 720, 723; 264/261, 263; 277/359–360, 652–653, 931, 933, 940; 361/704, 706–710, 717–720, 783; 428/40.1–40.2, 40.9, 344, 346, 356, 428/402–403; 438/122
See application file for complete search history.

(56) References Cited

U.S. PATENT DOCUMENTS 3,562,039 A  2/1971  Josef et al.
3,852,803 A  12/1974  Walmet
(Continued)

FOREIGN PATENT DOCUMENTS

DE  19581457 C1  4/1999
EP  2883930 A1 *  6/2015  .............. F28F 21/08
TW  200936028 A  8/2009

OTHER PUBLICATIONS

Xingcun Colin Tong., "Thermal Interface Materials in Electronic Packaging", Advanced Materials for Thermal Management of Electronic Packaging, Springer Link, 2011, vol. 30, pp. 305-371.
(Continued)

*Primary Examiner* — Jayprakash N Gandhi
*Assistant Examiner* — Amir Jalali
(74) *Attorney, Agent, or Firm* — Nitin N. Joshi

(57) ABSTRACT

A reusable phase-change thermal interface structure having a metal based foam and a fusible metal based alloy is provided. In a solid phase of the fusible metal based alloy the fusible metal based alloy is disposed at least in a portion of the metal based foam. Further, in a liquid phase of the fusible metal based alloy the fusible metal based alloy is disposed at least on a portion of one or more outer surfaces of the metal based foam.

15 Claims, 4 Drawing Sheets

(51) Int. Cl.
 *C09K 5/06* (2006.01)
 *H01L 23/427* (2006.01)
 *H05K 1/02* (2006.01)

(52) U.S. Cl.
 CPC ....... *H01L 23/4275* (2013.01); *H05K 1/0203* (2013.01); *H01L 2924/0002* (2013.01); *H05K 7/20672* (2013.01)

(56) References Cited

U.S. PATENT DOCUMENTS

| | | | |
|---|---|---|---|
| 4,081,825 A | 3/1978 | Koopman et al. | |
| 4,783,721 A * | 11/1988 | Yamamoto | G02F 1/0036 257/714 |
| 4,920,574 A * | 4/1990 | Yamamoto | H01L 23/4332 165/80.4 |
| 5,126,919 A * | 6/1992 | Yamamoto | G11B 5/64 165/80.3 |
| 5,198,189 A | 3/1993 | Booth et al. | |
| 5,225,964 A * | 7/1993 | Nemes | H05K 7/1404 165/185 |
| 5,291,371 A * | 3/1994 | Gruber | F28F 13/00 174/16.3 |
| 5,323,294 A * | 6/1994 | Layton | H01L 23/3733 165/185 |
| 5,561,590 A * | 10/1996 | Norell | H01L 23/3733 165/185 |
| 5,570,502 A * | 11/1996 | Sawtell | B22D 17/14 164/97 |
| 5,572,404 A * | 11/1996 | Layton | H01L 23/433 165/185 |
| 5,616,421 A * | 4/1997 | Sawtell | C22C 47/06 257/E23.112 |
| 5,673,176 A * | 9/1997 | Penniman | H05K 7/1422 257/718 |
| 6,003,221 A * | 12/1999 | Sawtell | C04B 41/88 174/16.3 |
| 6,095,397 A | 8/2000 | Wolf et al. | |
| 6,108,208 A | 8/2000 | Tustaniwskyj et al. | |
| 6,212,075 B1 | 4/2001 | Habing | |
| 6,220,607 B1 * | 4/2001 | Schneider | H01L 21/67103 277/650 |
| 6,243,944 B1 | 6/2001 | Tustaniwskyj et al. | |
| 6,246,582 B1 | 6/2001 | Habing | |
| 6,259,602 B1 * | 7/2001 | Malhammar | H01L 23/3672 165/185 |
| 6,281,573 B1 * | 8/2001 | Atwood | H01L 23/3675 165/80.3 |
| 6,343,647 B2 | 2/2002 | Kim et al. | |
| 6,387,343 B1 * | 5/2002 | Klett | C04B 38/00 423/448 |
| 6,391,442 B1 * | 5/2002 | Duvall | C09K 5/063 257/E23.089 |
| 6,437,240 B2 * | 8/2002 | Smith | 174/541 |
| 6,501,663 B1 * | 12/2002 | Pan | H01L 21/288 174/260 |
| 6,617,517 B2 | 9/2003 | Hill et al. | |
| 6,632,522 B1 * | 10/2003 | Hyde | A61L 15/585 427/208.4 |
| 6,665,186 B1 * | 12/2003 | Calmidi | H01L 23/16 165/80.4 |
| 6,728,113 B1 * | 4/2004 | Knight | G01R 31/3025 257/664 |
| 6,774,306 B2 * | 8/2004 | Smith | H01L 21/563 174/541 |
| 6,835,453 B2 * | 12/2004 | Greenwood | H01L 23/4275 257/E23.089 |
| 6,849,941 B1 * | 2/2005 | Hill | H01L 23/42 257/702 |
| 6,870,736 B2 * | 3/2005 | Lee | H01L 23/42 165/185 |
| 6,914,357 B2 * | 7/2005 | Tabatowski-Bush | H02K 3/522 174/16.2 |
| 6,949,822 B2 * | 9/2005 | Shivkumar | H01L 21/563 257/666 |
| 7,023,699 B2 * | 4/2006 | Glovatsky | H05K 7/2049 165/185 |
| 7,312,527 B2 * | 12/2007 | Sane | H01L 23/4275 257/686 |
| 7,349,221 B2 * | 3/2008 | Yurko | H05K 7/1404 165/80.2 |
| 7,369,411 B2 * | 5/2008 | Hill | H01L 23/4275 165/185 |
| 7,440,281 B2 * | 10/2008 | Bailey | H01L 23/26 257/E23.087 |
| 7,554,190 B2 * | 6/2009 | Macris | H01L 23/26 257/706 |
| 7,619,888 B2 * | 11/2009 | Yu | F28D 15/0233 165/104.33 |
| 7,709,296 B2 * | 5/2010 | Campbell | G02B 6/4201 257/714 |
| 7,709,951 B2 * | 5/2010 | Brodsky | H01L 23/42 257/675 |
| 7,744,991 B2 * | 6/2010 | Fischer | B32B 5/18 428/317.3 |
| 8,221,667 B2 * | 7/2012 | Yao | H01L 23/373 264/261 |
| 8,324,719 B2 * | 12/2012 | Clothier | H01L 23/48 257/690 |
| 8,448,693 B2 * | 5/2013 | Lundell | F28F 13/00 165/185 |
| 8,458,899 B2 * | 6/2013 | Mitchell | H05K 1/092 174/260 |
| 8,477,500 B2 | 7/2013 | Deng et al. | |
| 8,730,674 B2 * | 5/2014 | Dede | F25B 21/00 165/80.4 |
| 8,937,810 B2 * | 1/2015 | Brunschwiler | H05K 7/20772 165/104.33 |
| 8,947,873 B2 * | 2/2015 | Campbell | H05K 7/20236 361/679.52 |
| 9,500,416 B2 * | 11/2016 | Nguyen | B32B 37/00 |
| 2002/0067599 A1 * | 6/2002 | Mann | H01L 23/3672 361/704 |
| 2002/0157247 A1 * | 10/2002 | Li | C22C 1/1036 29/840 |
| 2003/0112603 A1 | 6/2003 | Roesner et al. | |
| 2004/0145048 A1 * | 7/2004 | Frisch | H01L 23/3672 257/712 |
| 2006/0040112 A1 * | 2/2006 | Dean | H01L 23/3735 428/447 |
| 2006/0109631 A1 | 5/2006 | Marro et al. | |
| 2006/0146496 A1 * | 7/2006 | Asfia | H05K 7/20672 361/700 |
| 2006/0157223 A1 * | 7/2006 | Gelorme | H01L 23/3733 165/80.3 |
| 2006/0164809 A1 * | 7/2006 | Yu | F28D 15/0233 361/704 |
| 2007/0023165 A1 * | 2/2007 | Lakes | C08K 3/04 165/80.2 |
| 2007/0164424 A1 * | 7/2007 | Dean | H01L 23/42 257/707 |
| 2007/0238282 A1 | 10/2007 | Furman et al. | |
| 2007/0253169 A1 | 11/2007 | Clawser | |
| 2007/0268673 A1 * | 11/2007 | Ankireddi | H01L 23/3677 361/710 |
| 2008/0011466 A1 * | 1/2008 | Albers | F24F 3/1417 165/185 |
| 2008/0026404 A1 | 1/2008 | Adler et al. | |
| 2008/0186678 A1 | 8/2008 | North et al. | |
| 2008/0265404 A1 | 10/2008 | Furman et al. | |
| 2008/0291634 A1 * | 11/2008 | Weiser | C09K 5/14 361/708 |
| 2009/0001576 A1 | 1/2009 | Tuli et al. | |
| 2009/0149021 A1 | 6/2009 | Hillman et al. | |
| 2009/0301691 A1 * | 12/2009 | Mohapatra | F28D 15/0266 165/104.17 |
| 2010/0034335 A1 | 2/2010 | Varanasi et al. | |
| 2010/0152066 A1 * | 6/2010 | Malik | B01L 3/5027 506/35 |

(56) References Cited

U.S. PATENT DOCUMENTS

| | | | | |
|---|---|---|---|---|
| 2010/0232129 | A1* | 9/2010 | Haba | G01R 31/2886 361/783 |
| 2010/0294475 | A1* | 11/2010 | Rush | B22F 3/1121 165/185 |
| 2010/0328896 | A1* | 12/2010 | Shaddock | B82Y 30/00 361/704 |
| 2011/0038124 | A1* | 2/2011 | Burnham | C08L 63/00 361/717 |
| 2011/0292613 | A1* | 12/2011 | Deng | H01L 23/367 361/720 |
| 2013/0138262 | A1* | 5/2013 | Busch | G06F 1/20 700/300 |
| 2013/0206363 | A1* | 8/2013 | Kirk | F28F 7/00 165/84 |
| 2013/0224510 | A1* | 8/2013 | Deng | H01L 23/42 428/576 |
| 2015/0060021 | A1* | 3/2015 | Chauhan | F28D 15/046 165/104.26 |
| 2015/0116940 | A1* | 4/2015 | Kim | H05K 1/0203 361/700 |
| 2015/0163897 | A1* | 6/2015 | Ju | H05K 1/0271 361/783 |
| 2015/0282380 | A1* | 10/2015 | De Bock | H01L 23/42 361/704 |

OTHER PUBLICATIONS

D. D. L. Chung., "Thermal Interface Materials", Journal of Materials Engineering and Performance, Springer Link Feb. 2001, vol. 10, Issue 1, pp. 56-59.

Nihad Dukhan et al, :An improved PCM heat storage technology utilizing metal foam. Thermal and Thermomechanical Phenomena in Electronic Systems (ITHERM), 2010 12th IEEE Intersociety Conference on IEEE, Piscataway, NJ, USA, Jun. 2, 2010, pp. 1-7. XP031743047. ISBN: 978-1-4244-5342-9.

EP Search Report issued on Apr. 20, 2015 in relation to corresponding EP application 14197291.9.

X.C. Tong.,"Thermal Interface Materials in Electronic Packaging", Advanced Materials for Thermal Management of Electronic Packaging,Springer Series in Advanced Microelectronics 30, Chapter 8, LLC 2011, 67 Pages.

International Search Report and Written Opinion issued in connection with related PCT Application No. PCT/US2013/024613 dated Jun. 21, 2013.

U.S. Non-Final Office Action issued in connection with Related U.S. Appl. No. 13/408,305 dated Dec. 27, 2013.

U.S. Final Office Action issued in connection with Related U.S. Appl. No. 13/408,305 dated May 21, 2014.

* cited by examiner

REUSABLE PHASE-CHANGE THERMAL INTERFACE STRUCTURES

BACKGROUND

Embodiments of the present specification relates to phase-change thermal interfaces, and more particularly to reusable phase-change thermal interface structures.

Typically, performance of an electronic system, such as electronic circuits is limited by the amount of heat dissipated by the electronic system. The amount of heat dissipated by the electronic system is a surrogate for the maximum junction temperature that the electronic system is allowed to experience. In one example, the electronic system includes a circuit card assembly mounted on a chassis. The circuit card assembly includes a printed circuit board having one or more chips or other surface mounted components. In operation, the one or more chips and/or the surface mounted components employed in the circuit card assembly generate heat and may be referred to as heat sources. For the individual heat sources as well as the electronic system as a whole to function consistently, it is desirable to actively dissipate the heat generated by these heat sources. Sometimes, the heat generated by the heat sources may be dissipated away from the heat sources via a conduction mechanism. Heat spreading structures or heat sinks may be present in the electronic system to facilitate heat dissipation through the conduction mechanism. For example, in the case of the circuit card assembly, the heat sinks may be disposed on the chassis to facilitate heat dissipation using the conduction mechanism. As will be appreciated, in the case of heat dissipation by the conduction mechanism, it is desirable to minimize cavities, crevices or any other surface irregularities that may otherwise be present between mating surfaces of the heat sources and the heat sinks to reduce resistance in a thermal conduction path. For example, in the case of the circuit card assembly, it is desirable to reduce or eliminate the surface irregularities between the chips and the heat sinks.

Generally, thermal interface materials are used in the electronic system to provide the thermal conduction path of low thermal resistance at the interfaces between the mating surfaces of the heat sources and the heat sinks. In particular, the thermal interface materials are positioned at the interface of the heat source and heat sink to fill gaps or voids between the two mating surfaces so that the thermal resistance is lowered, thereby allowing the heat to flow away efficiently from the heat source to the heat sink. However, the thermal conductivity of conventional thermal interface materials is extremely poor, as compared to metals. Typically, in an attempt to reduce the surface irregularities, the thermal conductivity may be compromised.

Also, in addition to reducing the thermal contact resistance, it is desirable for the thermal interface materials to reduce stresses resulting from mismatch in coefficient of thermal expansions of the materials of the heat source and the heat sink during temperature cycling in the electronic circuits. In some cases, the thermal interface materials include adhesives, greases, gels, phase change materials, pads, and thermal pastes. In other cases, the thermal interface materials may include a polymer matrix, such as an epoxy or silicone resin, and thermally conductive fillers such as boron nitride, alumina, aluminum, zinc oxide, and silver. In certain other cases, a liquid metal paste may be used as a thermal interface material. When a component employing the liquid metal paste is de-coupled from the electronic system, the liquid metal paste may be cleaned from surfaces of the component and the electronic system by using metal wool containing tin or copper filaments. However, such liquid metal pastes and other existing thermal interface materials are not configured for reusability. By way of example, cleaning the surfaces to remove the thermal interface material that exists in the form of greases, at each dismantling may become cumbersome. Further, in some cases, the thermal interface materials may not be reusable, and may need to be discarded after each use and replaced by a new thermal interface material.

BRIEF DESCRIPTION

In one embodiment, a reusable phase-change thermal interface structure having a metal based foam and a fusible metal based alloy is provided. In a solid phase of the fusible metal based alloy the fusible metal based alloy is disposed at least in a portion of the metal based foam. Further, in a liquid phase of the fusible metal based alloy the fusible metal based alloy is disposed at least on a portion of one or more outer surfaces of the metal based foam.

In another embodiment, an electronic system having a first surface, a second surface and a reusable phase-change thermal interface structure disposed between the first and second surfaces is provided. The reusable phase-change thermal interface structure includes a metal based foam and a fusible metal based alloy. In a solid phase of the fusible metal based alloy the fusible metal based alloy is disposed at least in a portion of the metal based foam. Further, in a liquid phase of the fusible metal based alloy the fusible metal based alloy is disposed at least on a portion of one or more outer surfaces of the metal based foam. Additionally, the fusible metal based alloy is configured to be in the solid phase at an assembling temperature and in the liquid phase at an operating temperature.

In yet another embodiment, a method for using the reusable phase-change thermal interface structure is provided. The method includes providing the reusable phase-change thermal interface structure, disposing the reusable phase-change thermal interface structure in at least a portion of one or more receptacles of a heat frame, and reversibly operatively coupling the heat frame having the reusable phase-change thermal interface structure with a chassis. The method further includes providing power to an electronic system employing a heat source and the heat frame having the reusable phase-change thermal interface structure, providing a path of low thermal resistance between the heat frame and the heat source, and switching off the power of the electronic system.

DRAWINGS

These and other features and aspects of embodiments of the present specification will become better understood when the following detailed description is read with reference to the accompanying drawings in which like characters represent like parts throughout the drawings, wherein.

DETAILED DESCRIPTION

Figure 1:
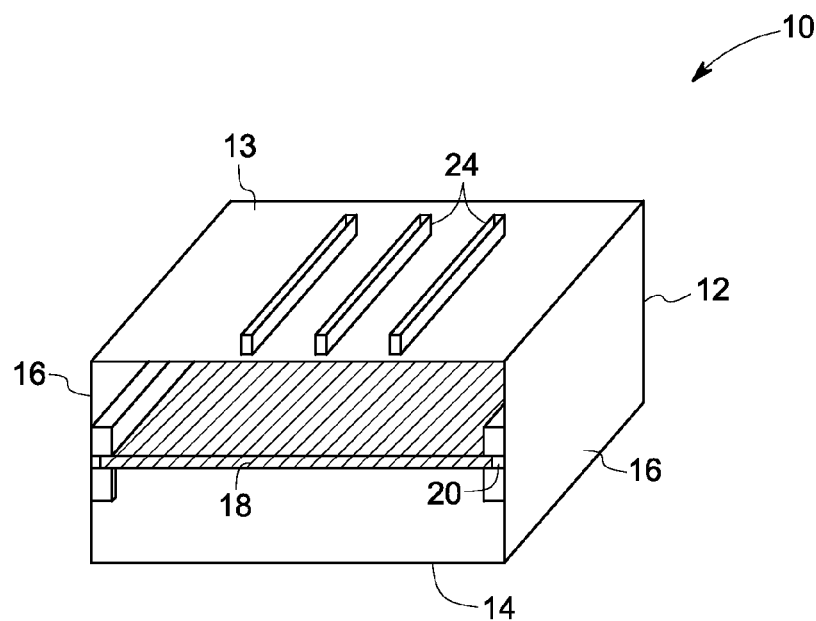
FIG. 1 is a perspective view of an example chassis housing at least a portion of a circuit card assembly, in accordance with aspects of the present specification.

Embodiments of the present specification relate to reusable phase-change thermal interface structures. In certain embodiments, a reusable phase-change thermal interface structure is configured to reduce cavities, irregularities, and crevices between mating surfaces of a heat source and a heat sink to facilitate heat transfer between the mating surfaces for at least a portion of a time period during which the system is in operation. Reducing or eliminating cavities, surface irregularities, and crevices between such mating surfaces may reduce or eliminate thermal contact resistance between the two mating surfaces and provide a path of low or least thermal resistance for heat dissipation using a conduction mechanism. In one example, the reusable phase-change thermal interface structure facilitates enhanced thermal heat transfer between a circuit card assembly and a chassis, where the circuit card assembly is disposed in the chassis in a re-insertable manner. As used herein, the term "re-insertable" suggests that the circuit card assembly may be configured to be mounted and decoupled from the chassis in a reversible manner and during normal operation of the system without the need for a system shut off.

It should be noted that although the present specification describes the reusable phase-change thermal interface structure disposed between a circuit card assembly and a chassis, however, embodiments of the present specification are operable with any apparatus that performs the functionality illustrated and described herein, or its equivalent. For example, and without limitation, the reusable phase-change thermal interface structure described herein may be disposed between a power supply unit and a base plate, a chassis and cooling fins, a chassis and a base plate, and the like, to reduce a thermal resistance between the heat sink and the heat source.

As used herein, an element or step recited in the singular and proceeded with the word "a" or "an" should be understood as not excluding plural of the elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

One or more specific embodiments of the present specification will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this specification.

FIG. 1 is a perspective view 10 of an example chassis 12 configured to be operatively coupled and decoupled to a circuit card assembly 18 more than once. The chassis 12 may include a first wall 13, a second wall 14, and a pair of side walls 16. The side walls 16 of the chassis 12 may include a slot 20 to receive the circuit card assembly 18. In one example, the slot 20 may be configured to receive the circuit card assembly 18 in a slidable manner. The circuit card assembly may be configured to be reversibly coupled and decoupled to the chassis 12. In one embodiment, the chassis 12 may have an open front and an open back to facilitate air flow through the chassis 12 and over the circuit card assembly 18. In another embodiment, however, the chassis 12 may be enclosed such that air is not permitted to flow into, or out of, the chassis 12 when the circuit card assembly 18 is mounted in the slot 20. Optionally, the chassis 12 may include a vent (not shown) configured to facilitate airflow into, and out of, the chassis 12. Alternatively or additionally, the chassis 12 may include a plurality of external fins 24 to facilitate convective heat transfer from the chassis 12 to air flowing over an exterior of the chassis 12 so as to facilitate heat dissipation from the circuit card assembly 18.

Figure 2:
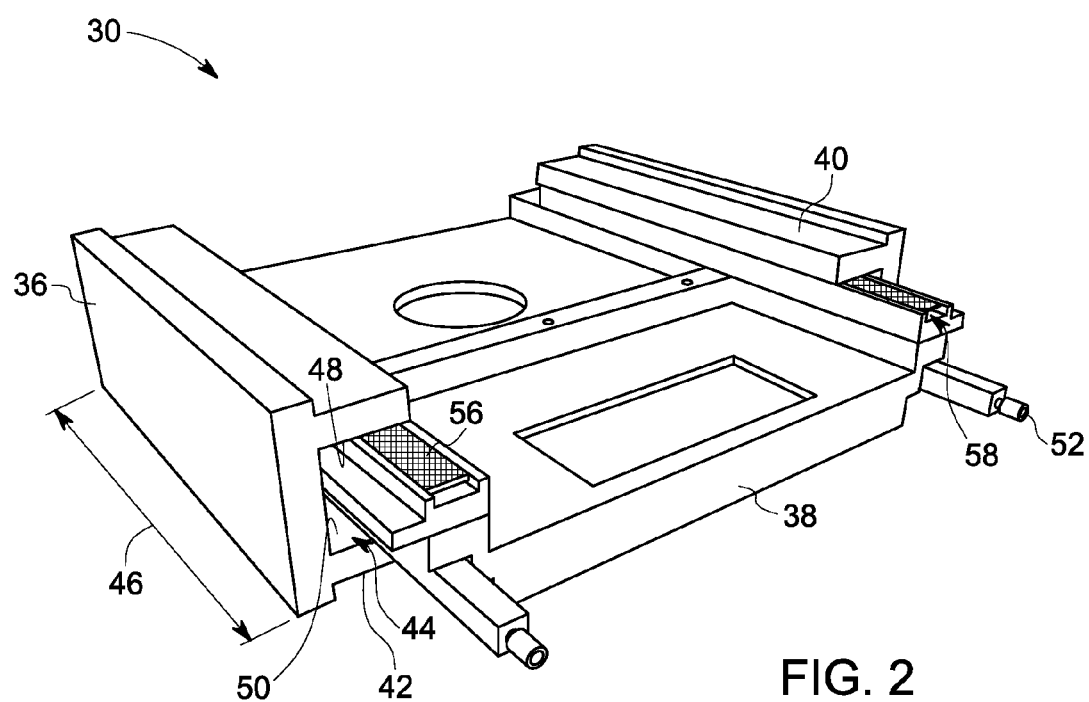
FIG. 2 is a perspective view of a portion of an electronic system having a chassis, a heat frame configured to receive a circuit card assembly and a reusable phase-change thermal interface structure, in accordance with aspects of the present specification.
Figure 3:
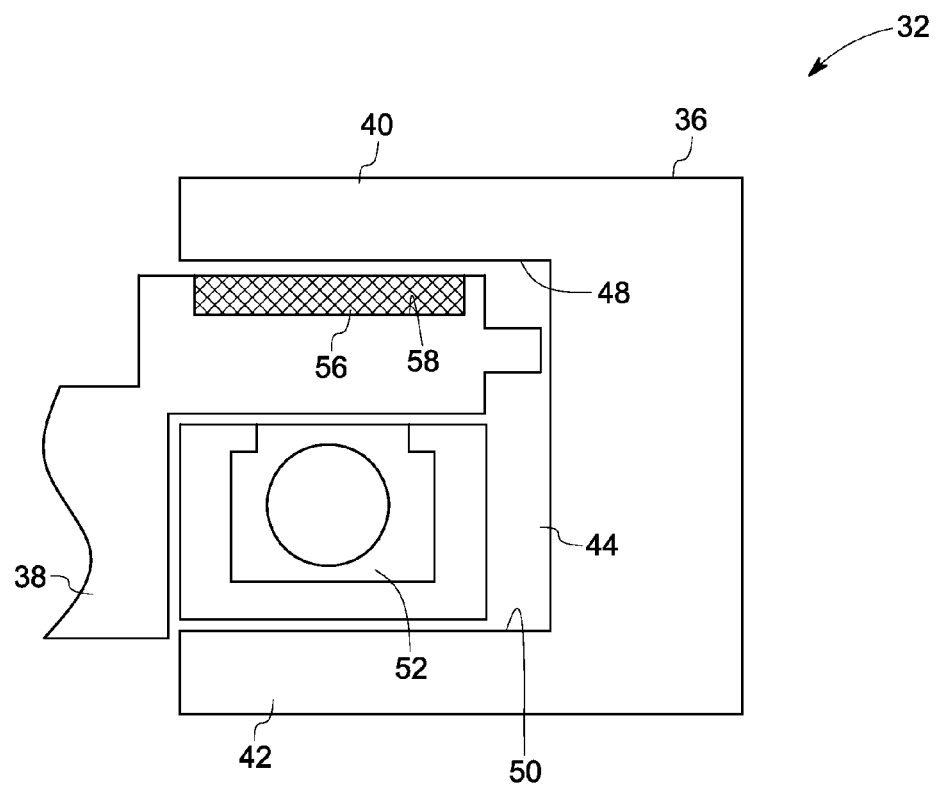
FIG. 3 is a side view of the chassis and the heat frame of FIG. 2, in accordance with aspects of the present specification.

FIGS. 2 and 3 illustrate a portion of an arrangement illustrated in FIG. 1. FIG. 2 illustrates a perspective view 30 and FIG. 3 illustrates a cross-sectional view 32 of a portion of an electronic system (not shown) having a chassis 36 and a heat frame 38 configured to receive a circuit card assembly (not shown). In the illustrated embodiment, the chassis 36 is in the form of a housing. The circuit card assembly may be disposed in the chassis 36 in a re-insertable manner such that the circuit card assembly may be operatively coupled and decoupled from the chassis 36 more than once. The chassis 36 includes a first wall 40 and a second wall 42 that form a receptor 44. The receptor 44 may extend along a length 46 of the chassis 36. The receptor 44 may include a first surface 48 and a second surface 50. The receptor 44 may be configured to receive at least a portion of the heat sink, such as a heat frame 38. The heat frame 38 may be operatively coupled to the circuit card assembly. A reusable phase-change thermal interface structure 56 may be disposed in a receptacle 58 formed in the heat frame 38. The heat frame 38 may be configured to facilitate exchange of heat between the circuit card assembly and the chassis 36 via the reusable phase-change thermal interface structure 56 to provide thermal cooling to the circuit card assembly. In particular, the heat frame 38 is configured to facilitate heat transfer from the circuit card assembly to the chassis 36. The heat frame 38 may include a physical structure that is suitable to receive the circuit card assembly.

Advantageously, the reusable phase-change thermal interface structure 56 is configured to provide a path of least thermal resistance to the heat or thermal energy being dissipated from the circuit card assembly to the chassis 36 via the heat frame 38. The reusable phase-change thermal interface structure 56 may be disposed between the heat frame 38 and the chassis 36. As will be described in detail with respect to FIGS. 5 and 6, the reusable phase-change thermal interface structure 56 includes metal based foam and a fusible metal based alloy. The fusible metal based alloy is configured to change from a solid phase to a liquid phase and vice versa. By way of example, at an assembly temperature or at an assembly stage, the fusible metal based alloy may be present at least in a portion of the metal based foam, while, at an operating temperature or during an operation stage, the fusible metal based alloy may convert to the liquid phase and may exist in the liquid phase during the operation of the system due to an increase in temperature of the system. When in the liquid phase, the fusible metal based alloy may be disposed on at least a portion of an outer surface of the metal based foam and may be configured to fill in at least a portion of surface irregularities present at the interface of the heat frame 38 and the chassis 36. Further, when in the liquid phase the fusible metal based alloy may also be disposed in an internal portion of the metal-based foam. Accordingly, the metal based foam provides a support and entrainment structure to the fusible metal based alloy, resulting in prevention of possible leakage of the fusible metal based alloy when the two mating surfaces are not in contact. Moreover, the fusible metal based alloy provides an enhanced thermal conductivity path between the heat source and the heat sink.

As used herein, the term "assembly temperature" refers generally to a temperature in the electronic system at which temperature the fusible metal based alloy exists in a solid phase. Similarly, as used herein, the term "assembly stage" refers to the stage of the electronic system before or sometime after the operation of the electronic system when the electronic system is at the assembly temperature, or when the fusible metal based alloy exists in the solid phase. Further, as used herein the term "operating temperature" is the temperature at which the electronic system including the reusable phase-change thermal interface structure 56 is performing an assigned operation. Also, as used herein, the term "operation stage" refers to the stage of the electronic system when the electronic system is performing an assigned function. In one embodiment, at the beginning of the operation stage, as the temperature of the heat source increases, the heat is transferred to one of the surfaces coupled to the heat source, and further is transferred through a surface of the reusable phase-change thermal interface structure 56 coupled to the heat sink. During this stage, the temperature of the reusable phase-change thermal interface structure 56 increases and the fusible metal based alloy melts and transitions to a liquid phase. In one embodiment, when the operation of the system is stabilized, the heat transfer from the surface coupled to the heat source and the surface coupled to the heat sink may be facilitated through the fusible metal based alloy. Moreover, in one embodiment, the assembling temperature may be less than about 85° C. Also, in another embodiment, the assembling temperature may be in a range from about 0° C. to about 50° C. In yet another embodiment, the assembling temperature may be in a range from about 15° C. to about 25° C. In certain embodiments, the operating temperature may be greater than the assembling temperature. In one example, the operating temperature may be greater than about 30° C. In a particular example, the operating temperature may be in a range from about 50° C. to about 125° C.

The electronic system may further includes a wedgelock structure 52 disposed between the first and second walls 40 and 42 of the chassis 36. The wedgelock structure 52 may be configured to facilitate securely coupling the circuit card assembly to the chassis 36. In the illustrated embodiment, the wedgelock structure 52 may be disposed adjacent to the second surface 50 of the receptor 44. It should be noted that the wedgelock structure 52 may be replaced with any other suitable mechanical locking mechanism, such as, but not limited to, a nut and bolt mechanism.

Figure 4:
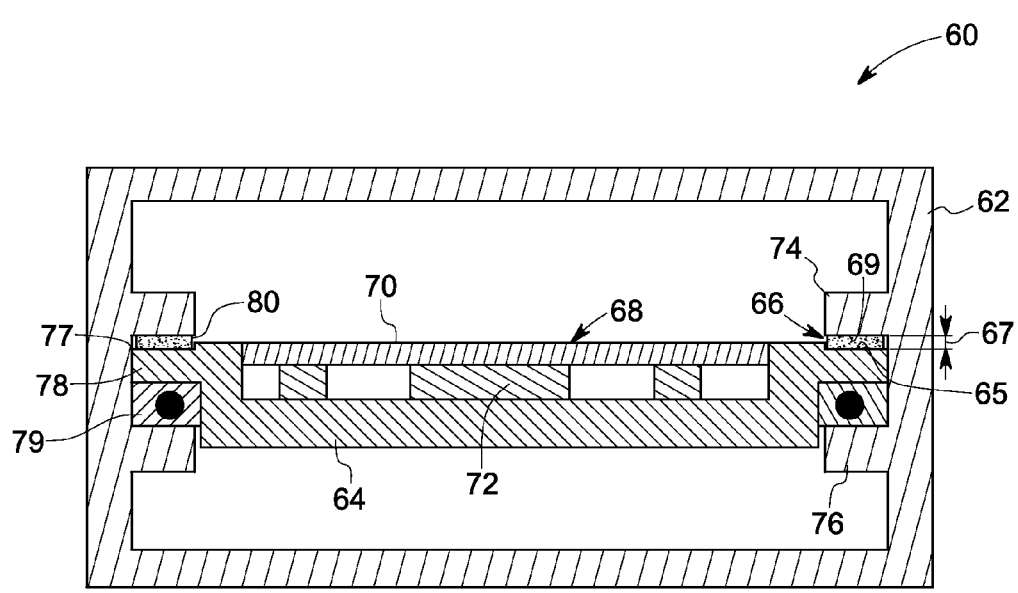
FIG. 4 is a cross-sectional view of an example electronic system employing a circuit card assembly and a reusable phase-change thermal interface structure, in accordance with aspects of the present specification.

FIG. 4 illustrates an example electronic system 60 employing a chassis 62, a heat frame 64, a reusable phase-change thermal interface structure 66 and a circuit card assembly 68. The system 60 also may also include a wedgelock mechanism 79. In one embodiment, the circuit card assembly 68 may include one or more printed circuit boards 70 and one or more processors 72, such as, but not limited to, a central processing unit, a graphics processing unit, or both. In operation, the processors 72 may generate heat and may act as one of the heat sources in the electronic system 60. The heat generated by the processors 72 may travel through the heat frame 64 to the chassis 62 via the reusable phase-change thermal interface structure 66. The reusable phase-change thermal interface structure 66 may be configured to provide a path of low thermal resistance between the heat frame 64 and the chassis 62 to facilitate heat transfer from the heat frame 64 to the chassis 62. In one embodiment, the reusable phase-change thermal interface structure 66 may be configured to reduce surface irregularities between the mating surfaces of the heat frame 64 and the chassis 62. The reusable phase-change thermal interface structure 66 is configured to provide an interface between the heat frame 64 and the chassis 62. Particularly, the reusable phase-change thermal interface structure 66 is configured to provide an interface between the heat frame 64 and walls 74 and 76 of the chassis 62. The reusable phase-change thermal interface structure 66 may be disposed in a receptacle 80 formed in rails 78 of the heat frame 64. The reusable phase-change thermal interface structure 66 may be disposed in a receptacle 77 disposed between a first surface 65, which is a surface of the receptacle 80; and a second surface 69, which is a surface of a portion of the chassis 62. In one embodiment, a thickness 67 of the reusable phase-change thermal interface structure 66 in between the first and second surfaces 65 and 69 during operation may be in a range from about 10 microns to about 1000 microns.

In one embodiment, the second surface 69 may have a desirable smoothness configured to decrease adherence of the reusable phase-change thermal interface structure 66 to the second surface 69. By way of example, a roughness of the second surface 69 may be less than about 25 μm. In one embodiment, the roughness of the second surface 69 is less than about 5 μm. In one embodiment, the second surface 69 may include a non-wetting composition for the reusable phase-change thermal interface structure 66. As used herein the term "non-wetting composition for the reusable phase-change thermal interface structure" refers to a composition of the second surface 69 that does not have any chemical or physical affinity to the reusable phase-change thermal interface structure 66. The second surface 69 may include aluminum, an aluminum composite, copper, or a copper composite. In one embodiment, the second surface 69 may be coated with oxides, nickel, chrome, or black anodized coating. In another embodiment, the second surface 69 is an aluminum surface.

Moreover, in one embodiment, the mating surfaces 65 and 69 of the heat frame 64 and the wall 74 of the chassis 62, respectively, are configured such that the surfaces of the heat frame 64 having the reusable phase-change thermal interface structure 66 and the chassis 62 are amenable to be frequently separated from each other. For example, in one embodiment, the mating surfaces are separated from each other and coupled again at least about 100 times in an operating life cycle. In the referenced electronic system 60, the circuit card assembly 68, and the heat frame 64 along with the reusable phase-change thermal interface structure 66 may be easily removed from the chassis 62, thereby facilitating hassle-free removal of at least a portion of the circuit card assembly 68 from the chassis 62. In one example, only one printed circuit board of the circuit card assembly 68 may be reversibly removed from the chassis 62.

Figure 5:
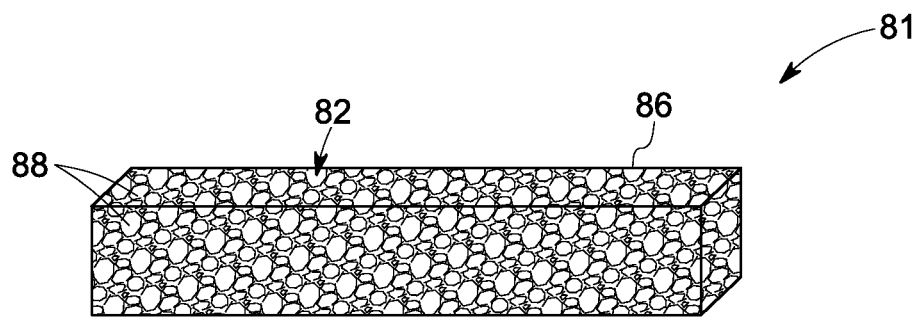
FIG. 5 is a perspective view of an example reusable phase-change thermal interface structure in an assembly stage, where the reusable phase-change thermal interface structure includes a metal based foam and a fusible metal based alloy, in accordance with aspects of the present specification.

FIG. 5 illustrates an example of a reusable phase-change thermal interface structure 81. The reusable phase-change thermal interface structure 81 includes a metal based foam 82 as a matrix, and a fusible metal based alloy (not shown) disposed at least in a portion of the matrix of the metal based foam 82. In the assembly stage or any time before or after operation of the electronic system employing the reusable phase-change thermal interface structure, the fusible metal based alloy may be disposed in at least a portion of a volume of the matrix. In one embodiment, the fusible metal based alloy may be disposed only within the portion of the metal based foam. In the assembly stage or before or after operation of the electronic system employing the reusable phase-change thermal interface structure, the fusible metal based alloy may not be disposed on an outer side of one or more surfaces 86 of the metal based foam 82. Accordingly, in the assembly stage or before or after operation of the electronic system, the fusible metal based alloy may not be in contact with the heat source.

As will be appreciated, the currently available thermally conductive interfaces are not configured for re-usability. For example, removal of thermal interface materials may require cleaning of surfaces on which the thermal interface material is disposed. Moreover, as will be appreciated, cleaning the surfaces to remove thermal interface material at each dismantling may be cumbersome as well as time consuming. Further, in some cases, the thermal interface materials may not be re-usable, and need to be discarded after each use and replaced by a new thermal interface material. For example, the liquid thermal interface material may not be used in re-insertable components due to difficulties in cleaning the surfaces employing such thermal interface materials. Advantageously, the reusable phase-change thermal interface structure 81 may be easily coupled with the surrounding structures, such as, but not limited to, the heat frame, the chassis, and the like. In the operation stage, the fusible metal based alloy disposed on the surface 86 of the metal based foam 82 may act as a liquid thermal interface material, and may have advantages, such as, but not limited to, a smooth interface, associated with a liquid based thermal interface material. While, before or after operation, the fusible metal based alloy may exist in the solid phase and hence, may be easily decoupled from at least a portion of the electronic system. Hence, the structure of the reusable phase-change thermal interface structure provides the advantages of a liquid thermal interface material, while avoiding the problems associated with the liquid thermal interface material.

In certain embodiments, the metal based foam 82 may include a cellular structure having a solid metal based material, such as, but not limited to, a metal, a metal alloy, a metal composite, metallites, and pores disposed between the solid metal based material. Non-limiting examples of the solid metal based material may include aluminum, titanium, tantalum, copper, or alloys or composites thereof. As used herein, the term "foam" may entail a specifically designed, machined or three-dimensional (3D) printed structure. In some embodiments, the metal based foam may include non-metallic components, such as, but not limited to, polymers, grapheme, or like materials. In one embodiment, a volume fraction of the pores, also referred to as "porosity" may be in a range from about 40% to about 95% of the volume of the metal based foam 82. The porosity of the metal based foam 82 may be determined based on a desirable mechanical strength for given dimensions of the reusable phase-change thermal interface structure. In some embodiments, pores 88 in the metal based foam 82 may be interconnected to form an interconnected network of the pores 88. In certain embodiments, the metal based foam 82 may include porous structures or open-celled foam having an interconnected network of solid struts having a determined pore density or volume fraction of pores. The open-celled structure may be isotropic or anisotropic in a 3D space. In some other embodiments, the metal based foam 82 may include a combination of sealed and interconnected pores 88. The sealed pores may be pores that are disconnected from neighboring pores. The nature of pores (sealed or interconnected) and size and density of pores of the metal based foam 82 may be controlled during manufacturing of the foam. The metal based foam 82 is thermally conductive, and may have a coefficient of thermal expansion that is similar to the coefficient of thermal expansion of the material from which the metal based foam 82 is made of. By way of example, the coefficient of thermal expansion of aluminum based foam may be similar to the coefficient of thermal expansion of aluminum metal.

The metal based foam 82 may exhibit properties, such as, but not limited to, thermal shock resistance, high temperature resistance, corrosion resistance, resistance to wear and thermal cycling, resistance to high pressure, shock absorption, machinability, and combinations thereof. Thermal conductivity of the metal based foam 82 may be enhanced by disposing a fusible metal based alloy in at least a portion of the metal based foam 82. In one embodiment, the metal based foam 82 of the reusable phase-change thermal interface structure may experiences a pressure in a range from about 35 kPa (5 psi) to about 6900 kPa (1000 psi) at the operating temperature.

In the assembly stage, the fusible metal based alloy may be in a solid phase. Whereas, in the operation stage, the fusible metal based alloy may exist in a liquid phase and may be configured to be disposed on at least a portion of one or more outer surfaces of the metal based foam 84. In some embodiments, in the liquid phase, the fusible metal based alloy is configured to be pumped out of one or more pores 88 of the metal based foam 82 in the liquid phase. After operation, the fusible metal based alloy is configured to retract in the metal based foam prior to reconversion from the liquid phase to the solid phase. In certain embodiments, the fusible metal based alloy may include indium, bismuth, tin, gallium, lead or alloys, or combinations thereof. Further, in some embodiments, the metal based alloy may include alloys with one or more filler materials. The fillers may be used to enhance the thermal and/or mechanical properties of the fusible metal based alloy. Non-limiting examples of the fillers may include particles, rods, fibers, or combinations thereof. Moreover, in some embodiments, the fusible metal based alloy may have a melting point in a range from about 40° C. to about 220° C. The fusible metal based alloys may have a thermal conductivity in a range from about 10 W/mK to about 90 W/mK. Non-limiting examples of the fusible metal based alloys may include low temperature alloys, such as, but not limited to, indium, bismuth, tin, lead, gallium, or combinations thereof.

An effective thermal conductivity of the reusable phase-change thermal interface structure is a composite value based on individual thermal conductivities of the metal based foam 82, and fusible metal based alloy. In one embodiment, the thermal conductivity of the reusable phase-change thermal interface structure may be greater than about 1 W/mK. In one embodiment, the thermal conductivity of the reusable phase-change thermal interface structure may be in a range from about 5 W/mK to about 200 W/mK. In one embodiment, the thermal conductivity of the reusable phase-change thermal interface structure may be in a range from about 5 W/mK to about 25/mK. In another embodiment, the thermal conductivity of the reusable phase-change thermal interface structure may be in a range from about 100 W/mK to about 125/mK. The reusable phase-change thermal interface structure used herein is such that the material is solid at an assembling temperature and liquid at an operating temperature. As used herein the "assembling temperature" is the temperature at which the combination of the first surface and the reusable phase-change thermal interface structure 56 is brought in contact.

In certain embodiments, the reusable phase-change thermal interface structure may exhibit optimal thermal and mechanical properties and may be compatible with the present standard electronic assembly processes. Further, the reusable phase-change thermal interface structure may exhibit low bulk and interface thermal resistances, sufficient compliance to absorb thermally induced strain without causing early fatigue failure, sufficient conformability to accommodate surface roughness of the surfaces, ability to be processed at relatively low temperatures, robustness during storage and operation, and ability to be reworked and reused. Moreover, the reusable interface structure may be configured to account for manufacturing tolerances and other variables associated with fabricating a circuit card assembly. The devices, systems, and methods disclosed herein further facilitate reducing inconsistencies (such as gaps) in the contact between an electronic component of a circuit card assembly and the heat transfer device dedicated to cooling the electronic component. Additionally, the embodiments disclosed herein facilitate reducing thermal resistance in a processor of a circuit card assembly so as to mitigate the temperature increase of the processor during operation, thereby increasing processor power.

Figure 6:
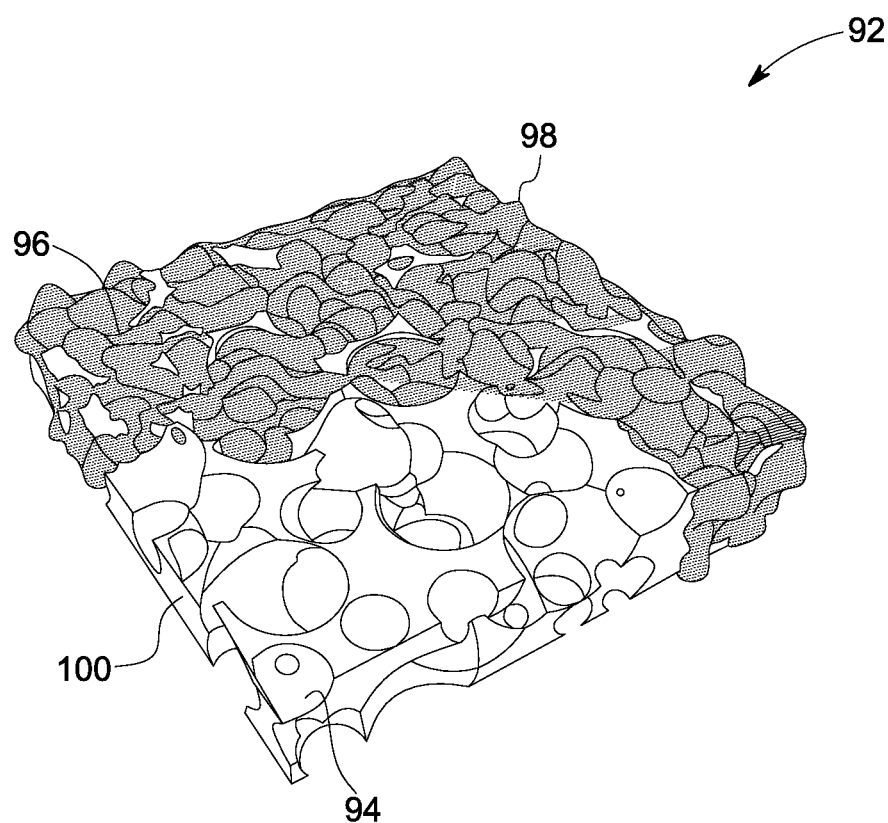
FIG. 6 is a perspective view of a portion of an example reusable phase-change thermal interface structure in an operation stage, in accordance with aspects of the present specification.

FIG. 6 illustrates a reusable phase-change thermal interface structure 92 in the operation stage of the electronic system employing the reusable phase-change thermal interface structure 92. In the illustrated embodiment, the reusable phase-change thermal interface structure 92 may include a metal based foam 94 and a fusible metal based alloy 96. The fusible metal based alloy 96 may be disposed as a layer 98 on one or more outer surfaces 100 of the metal based foam 94. Further, a portion of the fusible metal based alloy 96 may also be disposed in a volume of the foam 94. The layer 98 of the fusible metal based alloy may be configured to provide a smoother interface between a heat source and a heat sink by filling one or more cavities and crevices that may exist at the interface of the heat frame and the chassis. The layer 98 of the fusible metal based alloy formed on the outer surfaces 100 of the metal based foam 94 may be continuous or discontinuous.

After operation of the electronic system, when the heat source (e.g., circuit card assembly) and heat sink (e.g., chassis) attains a determined temperature, and there is little or no need for heat transfer between the heat source and the heat sink, the fusible metal based alloy 96 may be configured to retract in the metal based foam 94. It may be noted that "after operation" may include instances in time immediately after operation, or at a determined time after the device is switched off. The fusible metal based alloy 96 may be configured to retract instantly or gradually. Further, the fusible metal based alloy 96 may be configured to retract in the metal based foam 94 completely or partially. In one example, a very small portion of the fusible metal based alloy 96 may remain on a surface of the metal based foam 94, where the surface is disposed adjacent the heat sink. Once the fusible metal based alloy 96 is retracted in the metal based foam 94, the fusible metal based alloy 96 may be configured to solidify. At this instance, the circuit card assembly may be taken out of the chassis without causing any damage, or leaving any impurity of the interface material on the rails.

In one example, the fusible metal based alloy 96 may be configured to instantly liquefy when the temperature of the heat sink exceeds a determined temperature. Further, the fusible metal based alloy may be configured to instantly retract and solidify when the temperature of the heat sink reaches below a determined temperature. Accordingly, a composition of the fusible metal based alloy may be such that the fusible metal based alloy is configured to switch between the liquid and solid phases within a relatively short time of few nanoseconds based on the melting point of the fusible metal based alloy.

Figure 7:
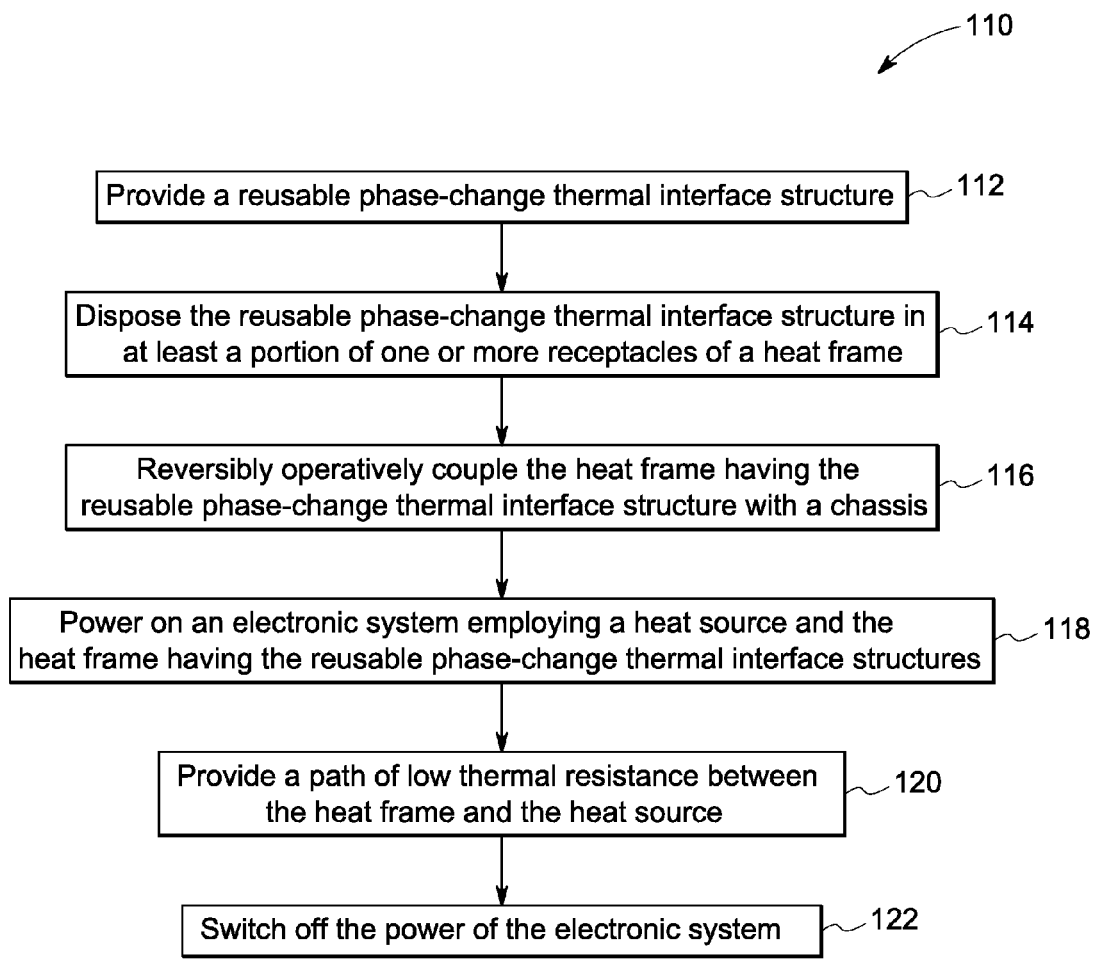
FIG. 7 is a block diagram of an example method of using the thermal interface structure, in accordance with aspects of the present specification.

FIG. 7 illustrates a flow diagram 110 of an example method of use of a reusable phase-change thermal interface structure employed in an electronic system. At block 112, one or more reusable phase-change thermal interface structures may be provided. In one embodiment, the reusable phase-change thermal interface structure may be provided at an assembly temperature. Furthermore, at block 114, the reusable phase-change thermal interface structures may be disposed in one or more corresponding receptacles in a heat frame. In one embodiment, the reusable phase-change thermal interface structures may be coupled to the corresponding receptacle using mechanical designs (e.g., shims, shoulders, etc.) or chemical means (e.g., adhesives) that facilitate retaining the reusable phase-change thermal interface structures in their respective positions during coupling and decoupling of circuit card assembly. At block 116, the heat frame having the reusable phase-change thermal interface structure may be operatively coupled to a chassis. In one embodiment, the heat frame may be reversibly operatively coupled to the chassis such that the heat frame may be decoupled from the chassis when required. By way of example, after operation, the heat frame along with the circuit card assembly may be removed from the chassis. At block 118, an electronic system employing the heat frame having the reusable phase-change thermal interface structures may be powered on. At block 120, a thermal path of low thermal resistance may be provided between a heat source (e.g., circuit card assembly) in the electronic system and the heat frame. The step of providing the path of low thermal resistance between the heat frame and the heat source may include heating the reusable phase-change thermal interface structure to a temperature above a melting point of a fusible metal alloy. The thermal path of low thermal resistance is provided due to presence of a fusible liquid metal alloy on a surface of the metal based foam. Furthermore, at block 122, the electronic system may be turned off. Subsequently; the fusible metal based alloy may retract in the metal based foam. Additionally, the reusable phase-change thermal interface structure may be cooled to a temperature below the melting point of the fusible metal based alloy to detach the heat frame from the chassis.

In certain embodiments, the metal based foam provides a support and entrainment structure to the fusible metal based alloy, resulting in prevention of possible leakage when the two mating surfaces are not in contact during the operation. In addition, the fusible metal based alloy provides an enhanced thermal conductivity path between the heat source and the heat sink. Hence, the reusable phase-change thermal interface structure is suitable for use in places where one or more components between which the reusable phase-change thermal interface structure is disposed need to be removed and re-inserted more than once. In one embodiment, surfaces of the chassis and the circuit card assembly having the reusable phase-change thermal interface structure are configured such that the first and second surfaces are amenable to be frequently separated from each other. For example, in one embodiment, the first and second surfaces are separated from each other and coupled again at least about 100 times in an operating life cycle. In one embodiment, different first surfaces are used along with one second surface. Also, in one embodiment, different second surfaces are used along with one first surface.

Advantageously, the re-usable thermal interface structure of the present specification includes optimal thermal and mechanical properties and is compatible with the present standard electronic assembly processes. Non-limiting examples of such thermal and mechanical properties may include low bulk and interface thermal resistances, sufficient compliance to absorb thermally induced strain without causing early fatigue failure, sufficient conformability to accommodate surface roughness of the surfaces, ability to be processed at relatively low temperatures, robustness during storage and operation, and ability to be reworked and reused.

While only certain features of the invention have been illustrated and described herein, many modifications and changes will occur to those skilled in the art. It is, therefore, to be understood that the appended claims are intended to cover all such modifications and changes as fall within the scope of the invention.

The invention claimed is:

1. An electronic system, comprising:
 a chassis having a pair of side walls, each said side wall defines a receptor, wherein each said receptor has a first surface and a second surface facing the first surface;
 a heat frame disposed in the chassis, extending between the pair of side walls such that a portion of the heat frame is disposed in the receptor defined in one side wall of the pair of side walls and another portion of the heat frame is disposed in the receptor defined in other side wall of the pair of side walls, wherein the heat frame is disposed in the chassis in a slidable manner;
 a circuit card assembly operatively coupled to the heat frame, wherein the circuit card assembly comprises:
  a printed circuit board; and
  at least one electronic component mounted on the printed circuit board;
 a reusable phase-change thermal interface structure disposed between the portion of the heat frame and the first surface of the receptor, wherein the heat frame is configured to facilitate exchange of heat between the circuit card assembly and the chassis via the reusable phase-change thermal interface structure; and wherein the reusable phase-change thermal interface structure comprises:
  a metal based foam; and
  a fusible metal based alloy disposed at least in a portion of the metal based foam, wherein the fusible metal based alloy is configured to be in solid phase at an assembling temperature and in liquid phase at an operating temperature, and
 a wedge lock structure disposed in the receptor between the portion of the heat frame and the second surface of the receptor.

2. The electronic system of claim 1, wherein a thickness of the reusable phase-change thermal interface structure during operation is in a range from 10 microns to 1000 microns.

3. The electronic system of claim 1, wherein the first surface has a surface roughness equal to or greater than 25 microns.

4. The electronic system of claim 1, wherein the reusable phase-change thermal interface structure experiences a pressure in a range from 35 k Pa (5 psi) to 6900 k Pa (1000 psi) at the operating temperature.

5. The electronic system of claim 1, wherein the at least one electronic component is a processor.

6. The electronic system of claim 1, wherein the metal based foam comprises interconnected pores.

7. The electronic system of claim 1, wherein the metal based foam comprises porous structures or an interconnected network of solid struts.

8. The electronic system of claim 1, wherein the metal based foam comprises aluminum, tantalum, titanium, copper, or alloys or composites thereof.

9. The electronic system of claim 1, wherein the fusible metal based alloy comprises indium, bismuth, tin, gallium, lead or alloys, or combinations thereof.

10. The electronic system of claim 1, wherein the fusible metal based alloy is configured to be pumped out of one or more pores of the metal based foam in the liquid phase of the fusible metal based alloy.

11. The electronic system of claim 1, wherein the fusible metal based alloy is configured to retract in the metal based foam prior to conversion from the liquid phase to the solid phase.

12. The electronic system of claim 1, wherein the assembling temperature of the reusable phase-change thermal interface structure is less than 85° C.

13. The electronic system of claim 1, wherein the operating temperature of the reusable phase-change thermal interface structure is greater than 30° C.

14. The electronic system of claim 1, wherein the fusible metal based alloy is configured to exist in the liquid phase at a temperature in a range from 40° C. to 220° C.

15. The electronic system of claim 1, wherein the reusable phase-change thermal interface structure has a thermal conductivity equal to or more than 1 W/m K.

* * * * *